United States Patent
Cheng et al.

(10) Patent No.: US 9,633,911 B2
(45) Date of Patent: Apr. 25, 2017

(54) SIMPLIFIED MULTI-THRESHOLD VOLTAGE SCHEME FOR FULLY DEPLETED SOI MOSFETS

(71) Applicants: INTERNATIONAL BUSINESS MACHINES CORPORATION, Armonk, NY (US); STMicroelectronics, Inc., Coppell, TX (US); GLOBALFOUNDRIES Inc., Cayman Islands (KY)

(72) Inventors: Kangguo Cheng, Schenectady, NY (US); Bruce B. Doris, Brewster, NY (US); Ali Khakifirooz, Mountain View, CA (US); Qing Liu, Guilderland, NY (US); Nicolas Loubet, Guilderland, NY (US); Scott Luning, Albany, NY (US)

(73) Assignees: INTERNATIONAL BUSINESS MACHINES CORPORATION, Armonk, NY (US); STMICROELECTRONICS, INC., Coppell, TX (US); GLOBALFOUNDRIES INC., Cayman Islands (KY)

( * ) Notice: Subject to any disclaimer, the term of this patent is extended or adjusted under 35 U.S.C. 154(b) by 18 days.

(21) Appl. No.: 14/668,482

(22) Filed: Mar. 25, 2015

(65) Prior Publication Data

US 2015/0200205 A1 Jul. 16, 2015

Related U.S. Application Data

(62) Division of application No. 13/865,795, filed on Apr. 18, 2013.

(51) Int. Cl.
*H01L 43/02* (2006.01)
*H01L 43/08* (2006.01)
(Continued)

(52) U.S. Cl.
CPC .... *H01L 21/845* (2013.01); *H01L 21/823807* (2013.01); *H01L 21/823821* (2013.01);
(Continued)

(58) Field of Classification Search
CPC .............. H01L 27/092; H01L 27/0922; H01L 27/0928; H01L 21/823842; H01L 29/495; H01L 29/4966
See application file for complete search history.

(56) References Cited

U.S. PATENT DOCUMENTS 6,380,590 B1 4/2002 Yu
6,451,676 B2 9/2002 Wurzer et al.
(Continued)

OTHER PUBLICATIONS

Cheng, K., et al. "Extremely Thin SOI (ETSOI) Technology: Past, Present, and Future" 2010 IEEE International SOI Conference. Oct. 2010. (4 Pages).
(Continued)

*Primary Examiner* — Dale E Page
*Assistant Examiner* — John Bodnar
(74) *Attorney, Agent, or Firm* — Tutunjian & Bitetto, P.C.; Vazken Alexanian (57) ABSTRACT

A method for semiconductor fabrication includes providing channel regions on a substrate including at least one Silicon Germanium (SiGe) channel region, the substrate including a plurality of regions including a first region and a second region. Gate structures are formed for a first n-type field effect transistor (NFET) and a first p-type field effect transistor (PFET) in the first region and a second NFET and a second PFET in the second region, the gate structure for the first PFET being formed on the SiGe channel region. The gate structure for the first NFET includes a gate material having a first work function and the gate structures for the first PFET, second NFET and second PFET include a gate (Continued)

material having a second work function such that multi-threshold voltage devices are provided.

9 Claims, 10 Drawing Sheets

(51) Int. Cl.
| | |
|---|---|
| *H01L 43/12* | (2006.01) |
| *H01L 27/22* | (2006.01) |
| *H01L 43/10* | (2006.01) |
| *H01L 21/84* | (2006.01) |
| *H01L 27/12* | (2006.01) |
| *H01L 21/8238* | (2006.01) |
| *H01L 27/092* | (2006.01) |
| *H01L 29/49* | (2006.01) |
| *H01L 29/10* | (2006.01) |
| *H01L 29/16* | (2006.01) |
| *H01L 29/161* | (2006.01) |

(52) U.S. Cl.
CPC ...... *H01L 21/823842* (2013.01); *H01L 21/84* (2013.01); *H01L 27/092* (2013.01); *H01L 27/0922* (2013.01); *H01L 27/0924* (2013.01); *H01L 27/1203* (2013.01); *H01L 27/1211* (2013.01); *H01L 29/1054* (2013.01); *H01L 29/16* (2013.01); *H01L 29/161* (2013.01); *H01L 29/4966* (2013.01)

(56) References Cited

U.S. PATENT DOCUMENTS

| | | | |
|---|---|---|---|
| 6,693,331 B2 | 2/2004 | Mistry et al. | |
| 7,183,596 B2 | 2/2007 | Wu et al. | |
| 7,544,994 B2 | 6/2009 | Schepis et al. | |
| 7,667,278 B2 | 2/2010 | Cabral et al. | |
| 7,754,560 B2 | 7/2010 | Burnett et al. | |
| 7,902,014 B2 | 3/2011 | Doyle et al. | |
| 7,939,393 B2 | 5/2011 | Xiong et al. | |
| 8,034,679 B1 | 10/2011 | Bulucea | |
| 8,309,419 B2 | 11/2012 | Schaeffer et al. | |
| 8,357,574 B2 | 1/2013 | Yeh et al. | |
| 8,445,356 B1 | 5/2013 | Cai et al. | |
| 2001/0025997 A1 | 10/2001 | Onishi | |
| 2007/0090416 A1 | 4/2007 | Doyle et al. | |
| 2007/0111448 A1 | 5/2007 | Li et al. | |
| 2008/0237717 A1* | 10/2008 | Chen | H01L 21/76267 257/348 |
| 2009/0134468 A1* | 5/2009 | Tsuchiya | H01L 21/84 257/368 |
| 2009/0298245 A1 | 12/2009 | Doris et al. | |
| 2011/0180880 A1* | 7/2011 | Chudzik | H01L 21/28185 257/369 |
| 2011/0198699 A1* | 8/2011 | Hung | H01L 27/11 257/369 |
| 2012/0146147 A1 | 6/2012 | Hook | |
| 2012/0153401 A1* | 6/2012 | Javorka | H01L 21/82341 257/392 |
| 2013/0065366 A1* | 3/2013 | Thomas | H01L 21/84 438/154 |
| 2013/0270645 A1* | 10/2013 | Scheiper | H01L 21/82384 257/369 |
| 2013/0270647 A1* | 10/2013 | Zhu | H01L 21/022 257/369 |
| 2014/0070321 A1* | 3/2014 | Gerhardt | H01L 21/82380 257/368 |
| 2014/0206161 A1* | 7/2014 | Perng | H01L 21/82382 438/212 |

OTHER PUBLICATIONS

Cheng, K., et al. "ETSOI CMOS for System-On-Chip Applications Featuring 22NM Gate Length, Sub-100NM Gate Pitch, and 0.08 µM2 SRAM Cell" 2011 Symposium on VLSI Circuits. Jun. 2011. pp. 128-129.

Noel, J., et al. "Multi-VT UTBB FDSOI Device Architectures for Low-Power CMOS Circuit" IEEE Transactions on Electron Devices, vol. 58, No. 8. Aug. 2011. pp. 2473-2482.

Weber, O., et al. "Work-Function Engineering in Gate First Technology for Multi-V T Dual-Gate FDSOI CMOS on UTBOX" 2010 IEEE International Electron Devices Meeting (IEDM). Dec. 2010. pp. 3.4.1-3.4.4.

Cheng, K., et al. "FinFET and Method of Fabrication" U.S. Appl. No. 13/737,067, filed Jan. 9, 2013. (21 Pages).

International Search Report dated Aug. 18, 2014 for International Application No. PCT/US14/33181.

Non-Final Office Action mailed Sep. 10, 2014 for U.S. Appl. No. 13/865,795.

Final Office Action mailed Feb. 11, 2015 for U.S. Appl. No. 13/865,795.

\* cited by examiner

SIMPLIFIED MULTI-THRESHOLD VOLTAGE SCHEME FOR FULLY DEPLETED SOI MOSFETS

This application is a Divisional application of copending U.S. patent application Ser. No. 13/865,795 filed on Apr. 18, 2013, which is incorporated herein by reference in its entirety.

BACKGROUND

Technical Field

The present invention relates to semiconductor device fabrication, and more particularly to a simplified multi-threshold voltage scheme for fully depleted semiconductor-on-insulator MOSFETs.

Description of the Related Art

The threshold voltage for a field effect transistor (FET), for example a metal-oxide-semiconductor (MOSFET), is the gate voltage necessary to initiate conduction. Conventional approaches to offer multi-threshold voltage devices on fully depleted MOSFETs (metal-oxide-semiconductor field-effect transistor), such as ETSOIs (extremely thin semiconductor-on-insulator) or FinFETs (fin field effect transistors), are based on a combination of: gate length modulation, channel doping, work function adjustment and, in the case of thin BOX (buried oxide) FDSOI (fully depleted semiconductor-on-insulator) devices, a backbias or backgate doping. However, each of these approaches has drawbacks. For example, gate length modulation offers a maximum of about 50 mV of threshold voltage modulation for typical device dimensions, since lithography techniques to define different gate lengths limit the device pitch. Channel doping leads to random dopant fluctuation. Work function adjustment requires multiple gate stacks to be integrated, which in practice is very challenging. Backbias and/or backgate doping offers a maximum of about 100 mV of threshold voltage modulation with typical BOX thicknesses of 20 nm or more and is not useful for FinFETs.

SUMMARY

A method for semiconductor fabrication includes providing channel regions on a substrate including at least one Silicon Germanium (SiGe) channel region, the substrate including a plurality of regions including a first region and a second region. Gate structures are formed for a first n-type field effect transistor (NFET) and a first p-type field effect transistor (PFET) in the first region and a second NFET and a second PFET in the second region, the gate structure for the first PFET being formed on the SiGe channel region. The gate structure for the first NFET includes a gate material having a first work function and the gate structures for the first PFET, second NFET and second PFET include a gate material having a second work function such that multi-threshold voltage devices are provided.

A method for semiconductor fabrication includes providing channel regions on a substrate including at least one Silicon Germanium (SiGe) channel region, the substrate including a plurality of regions including a low threshold voltage (LVT) region and a high threshold voltage (HVT) region. Gate structures are formed for a first complementary metal-oxide-semiconductor (CMOS) device including a first n-type field effect transistor (NFET) and a first p-type field effect transistor (PFET) in the LVT region and a second CMOS device including a second NFET and a second PFET in the HVT region, the gate structure for the first PFET being formed on the SiGe channel region. The gate structure for the first NFET includes a gate material having a quartergap work function and the gate structures for the first PFET, second NFET and second PFET include a gate material having a midgap work function such that multi-threshold voltage devices are provided.

A semiconductor device includes a substrate having a plurality of regions including a first region and a second region. Channel regions formed on the substrate include at least one Silicon Germanium (SiGe) channel region. Gate structures are formed for a first n-type field effect transistor (NFET) and a first p-type field effect transistor (PFET) in the first region and a second NFET and a second PFET in the second region, the gate structure for the first PFET being formed on the SiGe channel region. The gate structure for the first NFET includes a gate material having a first work function and the gate structures for the first PFET, second NFET and second PFET include a gate material having a second work function such that multi-threshold voltage devices are provided.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, methods for fabricating a semiconductor device having a multi-threshold voltage scheme and devices thereof are provided. A multi-layer substrate is provided, which may include an extremely thin semiconductor-on-insulator, ultrathin body and buried oxide (BOX), etc. Channel regions are formed on the substrate, including at least one Silicon Germanium channel region. In some embodiments, forming the channel regions may include forming fins as the channel regions. The substrate may include a plurality of regions, including a first low threshold voltage region, which may be for, e.g., logic, and a second high threshold voltage region, which may be for, e.g., memory (e.g., static random access memory (SRAM)). Additional regions may be employed for additional threshold voltages, such as, e.g., regular threshold voltage regions.

The logic region may include a first complementary metal-oxide-semiconductor (CMOS) device, including a first n-type field effect transistor (NFET) and a first p-type field effect transistor (PFET). The SRAM region may include a second CMOS device, including a second NFET and a second PFET. Gate structures for the first and second CMOS devices are formed. Preferably, the gate structure for the first PFET is formed above the Silicon Germanium channel region.

Gate materials are selectively employed to provide a desired work function. Preferably, the first NFET includes a gate material having a first work function and the first PFET, second NFET and second PFET include a gate material having a second work function. The first work function may include a quartergap work function and the second work function may include a midgap work function.

The present principles provide for a multi-threshold voltage scheme. The threshold voltage shift for logic PFET is provided by a combination of the Silicon Germanium channel and the work function. For SRAM devices, the same work function is applied but with a Silicon channel to provide a higher threshold voltage.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
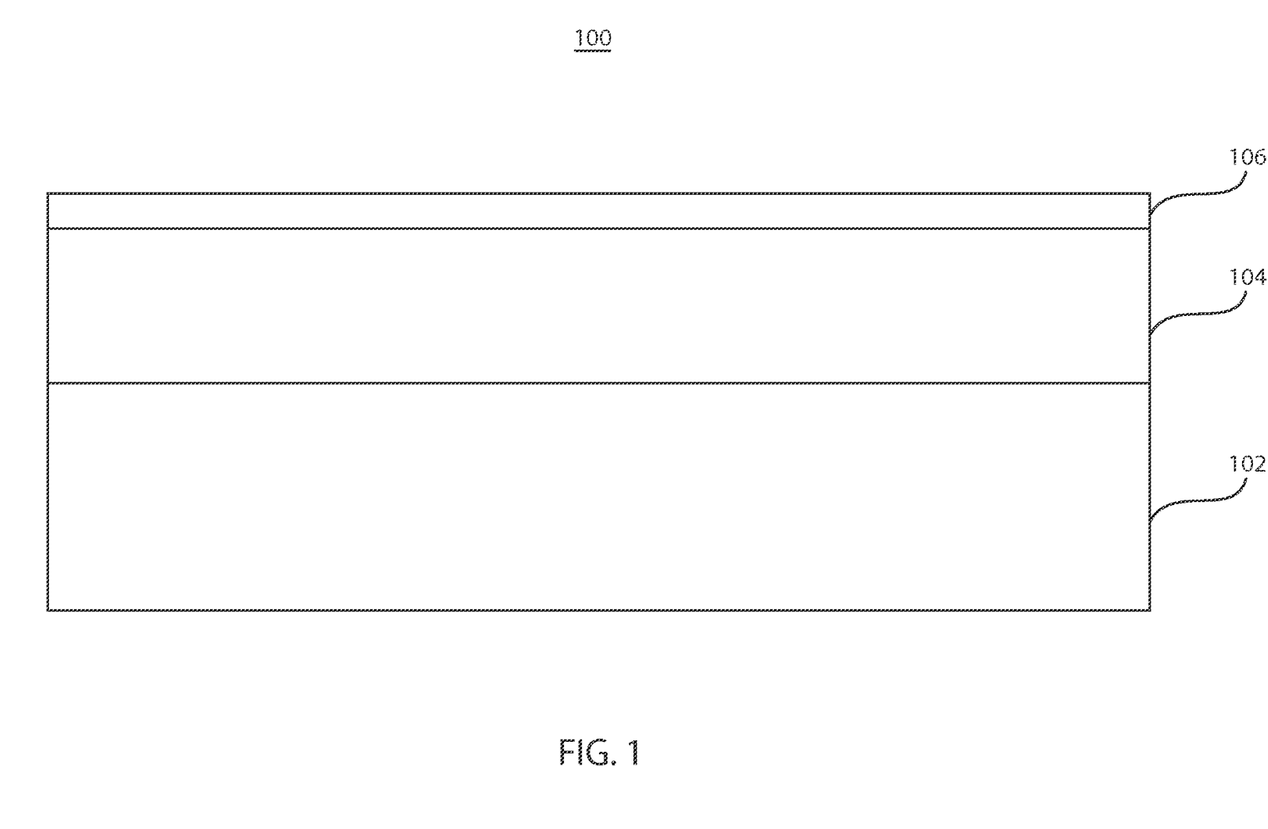
FIG. 1 is a cross-sectional view of a semiconductor structure having a silicon-on-insulator layer formed over a buried oxide layer, in accordance with one illustrative embodiment.

Referring now to the drawings in which like numerals represent the same or similar elements and initially to FIG. 1, a semiconductor structure 100 is illustratively depicted in accordance with one embodiment. The semiconductor structure 100 is formed in a semiconductor substrate 102, which may include bulk silicon, monocrystalline silicon, germanium, gallium arsenide, or any other suitable material or combination of materials. Substrate 102 preferably includes a buried oxide (BOX) layer 105 and a silicon-on-insulator (SOI) layer 106 formed in or on substrate 102.

The substrate 102 may include a fully depleted SOI 106 with thick BOX 104, such as, e.g., extremely thin SOI (ETSOI). BOX layer 102 is preferably a thick BOX layer, e.g., at or about 150-200 nm, but may also include other thicknesses. BOX layer 104 may include silicon dioxide, silicon nitride, or any other suitable material. SOI layer 106 is preferably an extremely thin SOI, e.g., at or about 2-10 nm, but may also include other thicknesses. SOI layer 106 may include any suitable semiconductor such as, e.g., silicon, germanium, silicon germanium, a group III-V semiconductor such as, e.g., gallium arsenide, a group II-VI semiconductor, etc. In some embodiments, the semiconductor structure 100 further comprises other features or structures that are formed in previous process steps.

Figure 2:
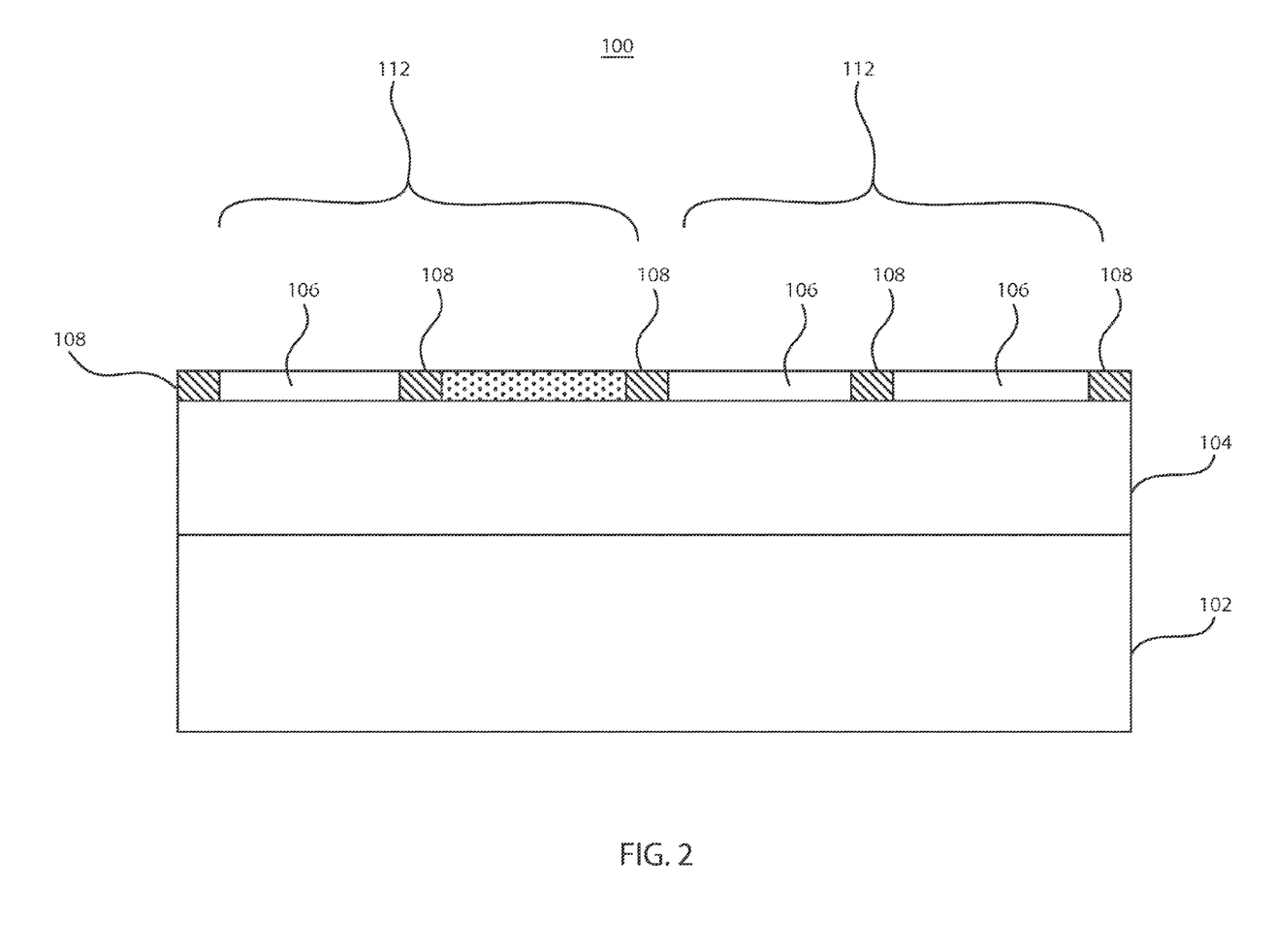
FIG. 2 is a cross-sectional view of the semiconductor structure of FIG. 1 after formation of shallow trench isolation regions and channel regions, including a silicon germanium channel region, in accordance with one illustrative embodiment.

Referring now to FIG. 2, processing of the semiconductor structure 100 continues. The semiconductor device includes a first region 112 and a second region 114. The first region 112 may include a low threshold voltage (LVT) region, such as, e.g., a logic region where timing is a constraint. The second region 114 may include a high threshold voltage (HVT) region, such as, e.g., a memory (e.g., static random access memory (SRAM)) region where leakage power is a constraint. It should be understood that semiconductor structure 100 may include any number of regions, in accordance with the present principles. For example, the semiconductor structure 100 may include a third region including a regular threshold voltage (RVT) region, such as, e.g., a logic region.

Shallow trench isolation (STI) dielectric regions 108 are formed by conventional methods to electrically separate devices and reduce parasitic currents and charge buildup. STI regions 108 may include an oxide, e.g., a silicon oxide.

Silicon Germanium (SiGe) layer 110 is formed from a portion of SOI layer 106. SiGe has a valence band shift when compared to Silicon (Si) that lowers the threshold voltage of p-type field effect transistors (PFETs) by about 200 mV for typical Germanium (Ge) concentration, compared to Silicon devices. In one embodiment, SiGe layer 110 is formed by etching the Silicon, leaving about, e.g., 2-4 nm, and epitaxially growing SiGe. In another embodiment, SiGe layer 110 is formed by epitaxially growing SiGe on SOI layer and diffusing Ge atoms into the Si layer with a thermal process. In yet another embodiment, SiGe layer 110 is formed by epitaxially growing SiGe on SOI layer and thermal oxidation. During this process Silicon atoms are oxidized leaving behind Ge atoms that diffuse into the SOI layer. Other techniques for forming SiGe layer 110 may also be employed within the scope of the present principles.

Figure 3:
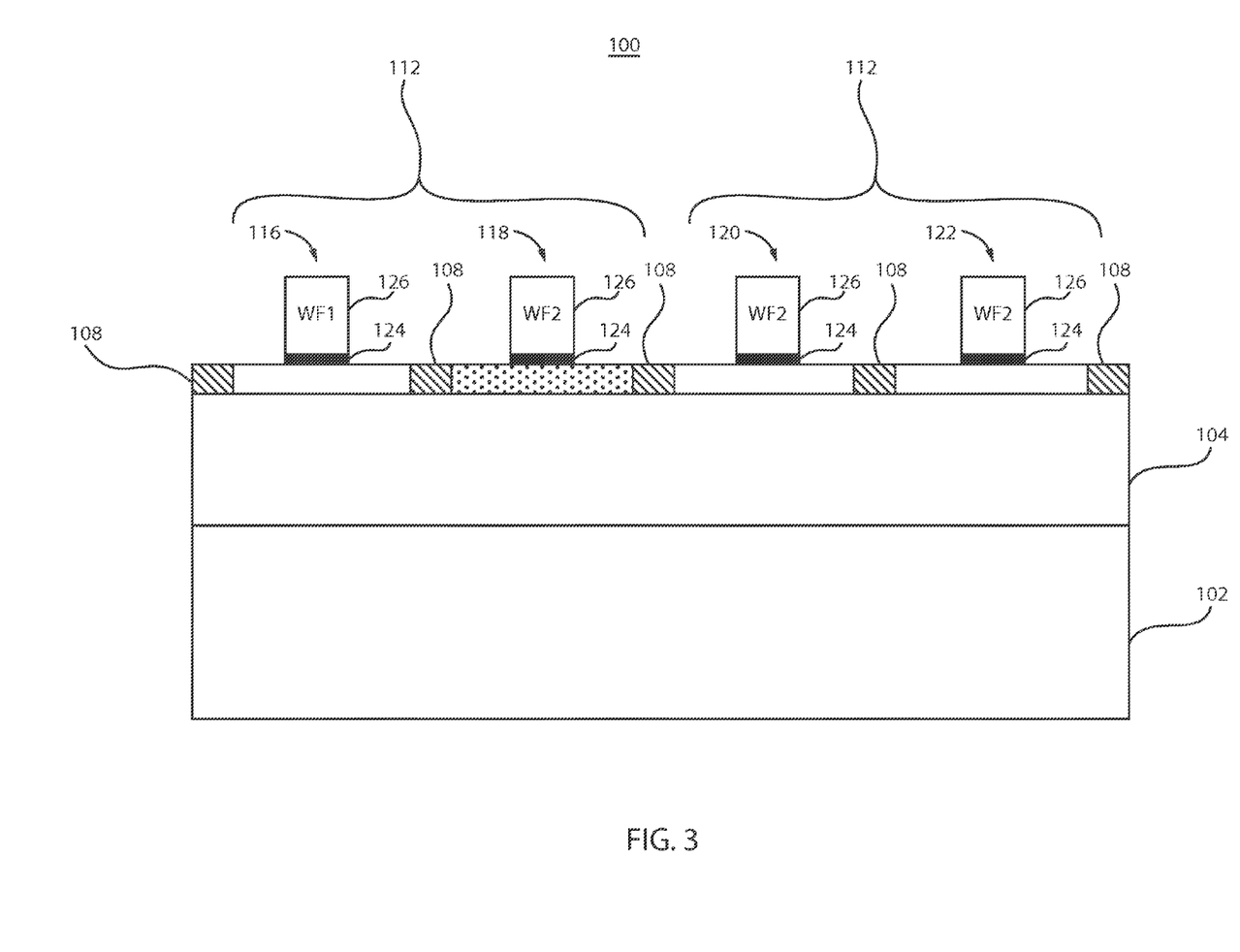
FIG. 3 is a cross-sectional view of the semiconductor structure of FIG. 2 having gate structures formed in regions of the substrate, in accordance with one illustrative embodiment.

Referring now to FIG. 3, processing of the semiconductor structure 100 is continued. Devices 116 and 118 are formed in the logic region 112 and devices 120 and 122 are formed in the SRAM region 114. Additional devices may also be formed in the logic region 112 and SRAM region 114. Preferably, devices 116 and 118 and devices 120 and 122 are complementary metal-oxide-semiconductors (CMOS) devices, which include an NFET (n-type field effect transistor) device and a PFET device. In a preferred embodiment, devices 116 and 120 include NFETs and devices 118 and 122 include PFETs. The PFET device 118 of the logic region 112 (e.g., the LVT region) is preferably formed over SiGe layer 110 (shown in FIG. 2). Devices 116, 120 and 122 are preferably formed over Silicon (Si) layer 106.

Gate structures for devices 116, 118, 120, 122 are formed. The gate structures include gate dielectrics 124 and gate electrodes 126, 128. The gate dielectric 126 may include a silicon oxide, silicon nitride, silicon oxynitride, organic dielectric, etc. In a preferred embodiment, gate dielectric 126 includes a high dielectric constant material, such as, e.g., metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, any suitable combination of those high-k materials, or any suitable combination of any high-k material with silicon oxide, silicon nitride, and/or silicon oxynitride.

Gate electrodes 126, 128 may be formed of a gate material associated with a desired work function. The work function of a material is the difference between the vacuum energy level and the Fermi energy level of the material. For example, in one embodiment, the gate electrodes may be formed of a low work function material, such as, e.g., polysilicon doped with an n-type material (e.g., Phosphorus, etc.), resulting in a relatively lower threshold voltage of an NFET. The gate electrodes may also be formed of a high work function material, such as, e.g., polysilicon doped with a p-type material (e.g., Boron, Boron Fluoride, etc.) or a metal (e.g., tungsten, titanium, tantalum, ruthenium, zirconium, cobalt, copper, aluminum, lead, platinum, tin, silver, gold), resulting in a relatively higher threshold voltage of an NFET. The gate electrodes may be formed of any other suitable material or combination of materials, in accordance with a desired work function.

In a preferred embodiment, the gate electrode 126 of NFET device 116 includes a gate material having a first work function WF1, while the gate electrode 128 of PFET device 118 includes a gate material having a second work function WF2. NFET device 116 is formed on Silicon layer 106, which may be strained or unstrained. PFET device 118 is formed on SiGe layer 110, which is preferably strained however may be unstrained.

Gate electrodes 128 of NFET device 120 and PFET device 122 preferably include a gate material having WF2. NFET device 120 and PFET device 122 are formed on Silicon layer 106, which may be strained or unstrained. It is noted that in a typical SRAM circuit, strain in the channel of PFET device 122 is completely relaxed if formed of SiGe. So the use of SiGe for PFET device 122 is not advantageous. In fact, smaller bandgap of SiGe leads to higher band-to-band tunneling, which is not desired for leakage constrained devices such as memory or HVT devices. If HVT devices are needed for logic region 112, they can use the same work function and channel used in devices in the SRAM region 114.

In a particularly useful embodiment, WF1 includes an n-type quartergap work function and WF2 includes a midgap work function. The effective work function of a quarter-gap device may be about 4.325 electron-volts (eV) and the effective work function of a midgap FET device may be about 4.600 eV. Other work functions may also be employed within the scope of the present principles. The gate electrodes 126 and 128 and gate dielectric 124 may be formed by either a gate-first or gate-last process.

In a gate-first process, a typical quarter-gap work function material may include, e.g., titanium nitride (TiN) formed on hafnium oxide or hafnium silicate gate dielectric. A mid-gap work function material may be formed by inserting, e.g., an aluminum containing layer over the high-k dielectric or in the TiN material.

In a gate-last process, a gate having a quarter-gap work function may be formed by using, e.g., aluminum gate metal and a lanthanum (La) containing threshold voltage adjusting layer. In this case a mid-gap material may be obtained by using a relatively thin (e.g., less than 4 angstrom) La containing layer. Other suitable materials and processes to form quarter-gap and mid-gap work function materials may also be employed. Processing of the semiconductor structure 100 may continue, e.g., to form spacers, source/drain regions, etc.

The SiGe channel of PFET device 118 gives a roughly 200-300 mV threshold voltage reduction compared to Silicon channel and midgap WF2. The threshold voltage reduction can be controlled by the concentration of the Ge atoms in the SiGe layer. In one embodiment, the Ge concentration in SiGe layer is preferably 20-30%. Devices of SRAM region 114 having an undoped Silicon channel and midgap WF2 give a long channel threshold voltage of around 500 mV corresponding to a short channel offset current, $I_{off}$, of about 100 pA/um for a typical device with reasonable threshold voltage roll-off of less than 100 mV and sub-threshold swing of around 80 mV. Devices of logic region 112 have a long channel threshold voltage of around 300 mV, corresponding to a short channel offset current of around 10 nA/um with typical device roll-off. It should be understood that threshold voltage may further be adjusted by employing conventional approaches. For example, about 50 mV threshold voltage adjustment can be obtained with gate length modulation or channel doping.

It is noted that the present principle may be applied to other structures. For example, the present principles may be applied to form multi-threshold voltage devices on SOI FinFETs (fin field effect transistors), as illustratively depicted in FIGS. 4-6. In another example, the present principles may be applied to form multi-threshold voltage devices on UTBB (ultrathin body and BOX), as illustratively depicted in FIGS. 7-9. Other applications are also contemplated.

Figure 4:
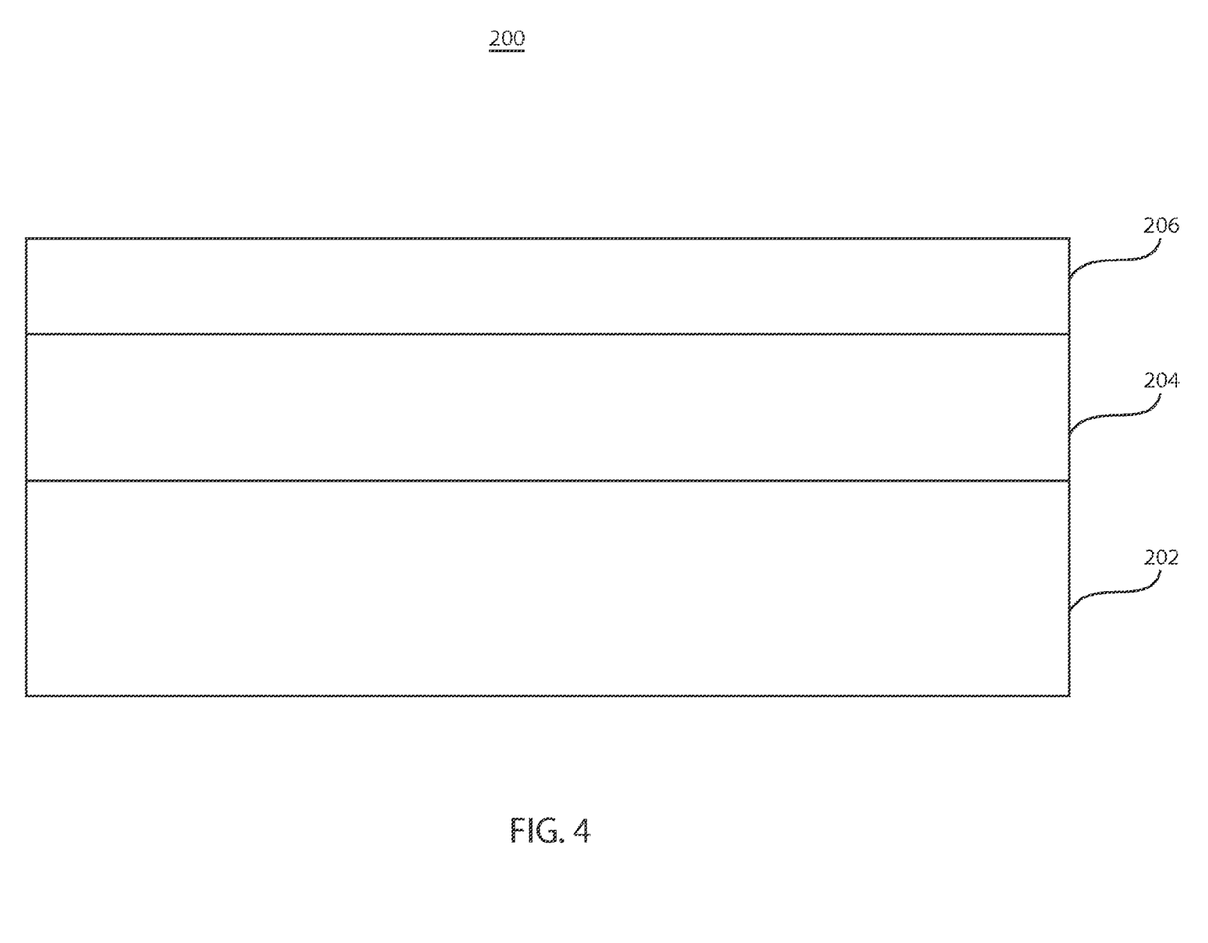
FIG. 4 is a cross-sectional view of a semiconductor structure having a semiconductor-on-insulator layer formed over a buried oxide layer, in accordance with one illustrative embodiment.

Referring now to FIG. 4, a semiconductor structure 200 is illustratively depicted in accordance with one embodiment. The present principles are applied to form multi-threshold voltage devices on FinFETs. The semiconductor structure 200 is formed on a substrate 202, which preferably includes a BOX layer 204 and an SOI layer 206 formed in or on substrate 202. In some embodiments, the substrate 202 may also include other features or structures formed in or on the semiconductor substrate in previous process steps.

Figure 5:
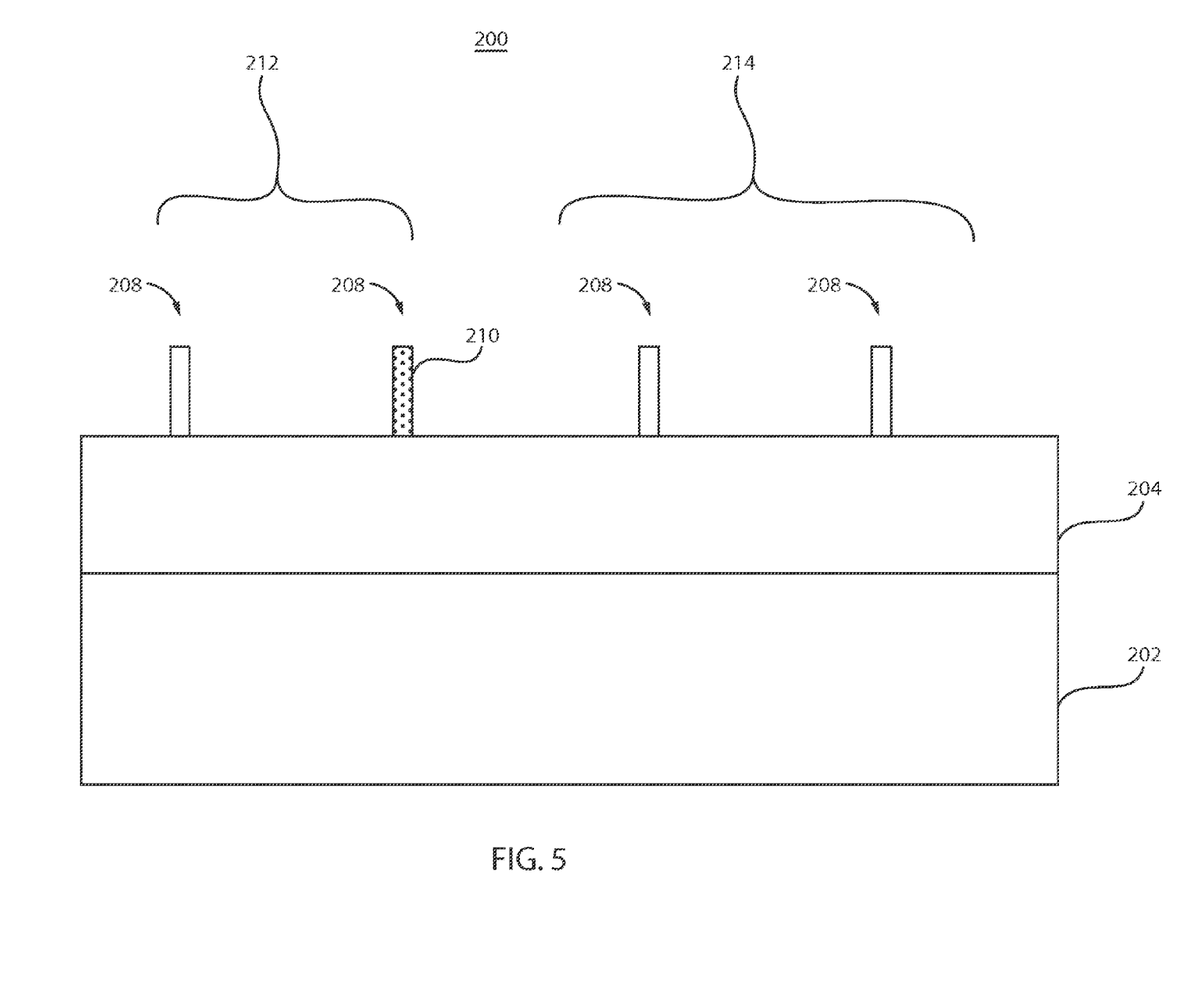
FIG. 5 is a cross-sectional view of the semiconductor structure of FIG. 4 after formation of fins, in accordance with one illustrative embodiment.

Referring now to FIG. 5, processing on the semiconductor structure 200 is continued. The semiconductor structure 200 includes a first region 212 and a second region 214. The first region 212 may include a LVT region, such as, e.g., a logic region where timing is a constraint. The second region 214 may include an HVT region, such as, e.g., an SRAM region where leakage power is a constraint. Additional regions are also contemplated, such as, e.g., an RVT region.

Mandrels 208 are formed on the BOX layer 204 in the logic region 212 and SRAM region 214. Mandrels 208 preferably include fins. Additional fins may also be formed in the logic region 212 and SRAM region 214. Fins 208 may be formed using a lithographic process that may include a resist layer (not shown) and lithographic patterning. In some embodiment, patterning of the fins 208 may be performed using a side-wall image transfer (SIT), directional self-assembly (DSA), or any suitable method capable of producing dimensions smaller than the minimum feature size achievable by lithographic patterning.

Fin 210 preferably includes a SiGe fin. SiGe mandrel 210 may be formed by thinning the SOI layer and epitaxially growing SiGe, growing SiGe and diffusing Ge atoms, or by epitaxially growing SiGe followed by oxidation to diffuse Ge atoms into Si. Other techniques for forming SiGe mandrel 210 may also be employed.

Figure 6:
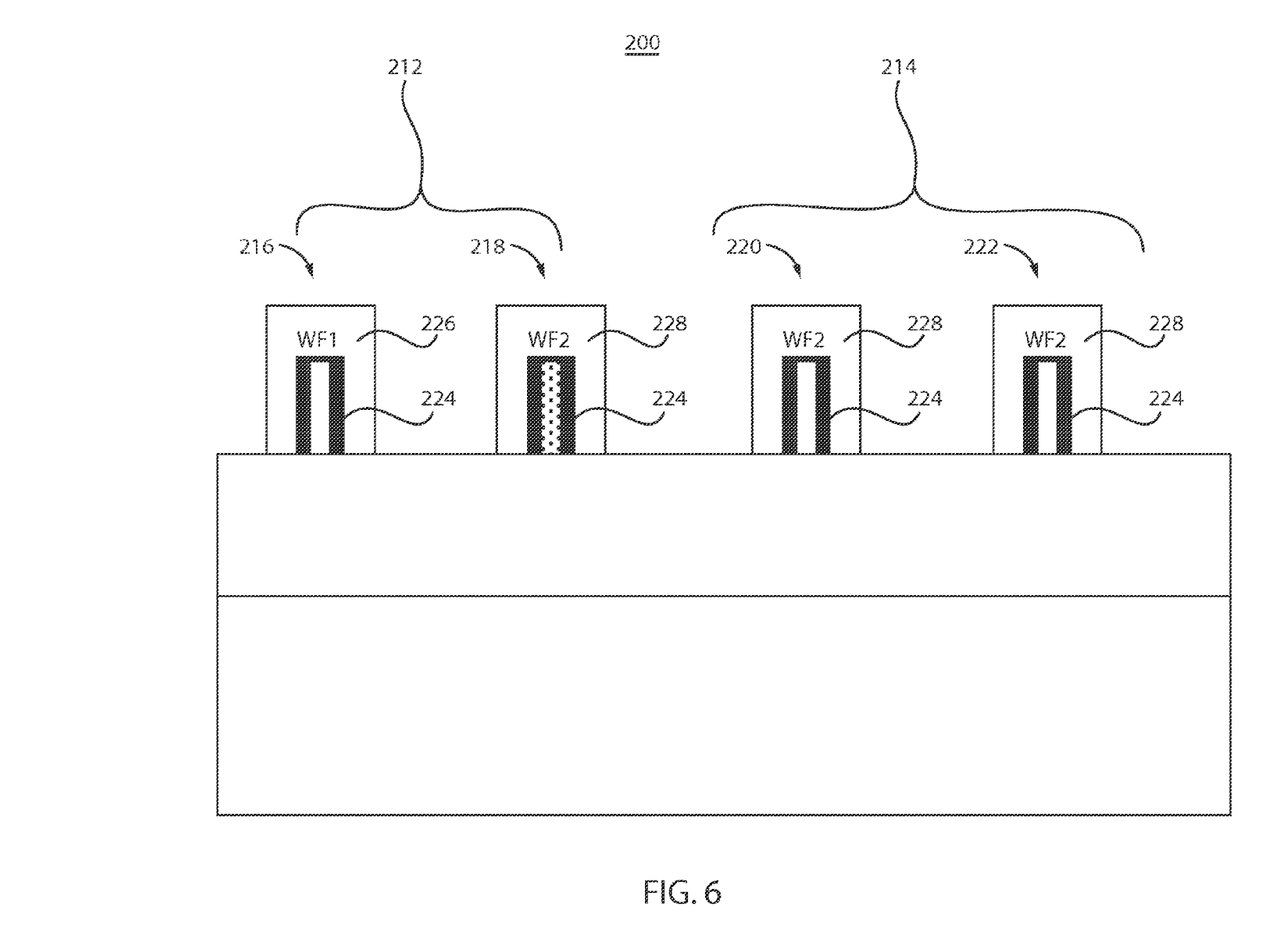
FIG. 6 is a cross-sectional view of the semiconductor structure of FIG. 5 having gate structures formed around the fins, in accordance with one illustrative embodiment.

Referring now to FIG. 6, devices are formed. Devices 216 and 218 are formed in the logic region 212 and devices 220 and 222 are formed in the SRAM region 214. Additional devices may be formed in the logic region 212 and SRAM region 214. Preferably, devices 216 and 218 and devices 220 and 222 are device pairs, such as, e.g., CMOS, which include NFETs 216 and 220 and PFETs 218 and 222. PFET 218 of the logic region 212 is preferably formed over SiGe mandrel 210 (shown in FIG. 5).

Gate structures for devices 216, 218, 220, 222 are formed, which include gate dielectrics 224 and gate electrodes 226, 228. Gate electrodes 226, 228 are formed of a gate material associated with a desired work function. In a preferred embodiment, gate electrode 226 of NFET device 216 includes a gate material having WF1, while gate electrodes 228 of PFET devices 218, 222 and NFET device 220 include a gate material having WF2. Preferably, WF1 includes an n-type quartergap work function and WF2 includes a midgap work function. Other work functions may also be employed.

The SiGe channel of PFET device 218 gives a roughly 200-300 mV threshold voltage reduction compared to Silicon channel and midgap WF2. Devices in SRAM region 214 provide a long channel threshold voltage of around 500 mV and devices in logic region 212 provide a long channel threshold voltage of around 300 mV, in accordance with one embodiment.

Figure 7:
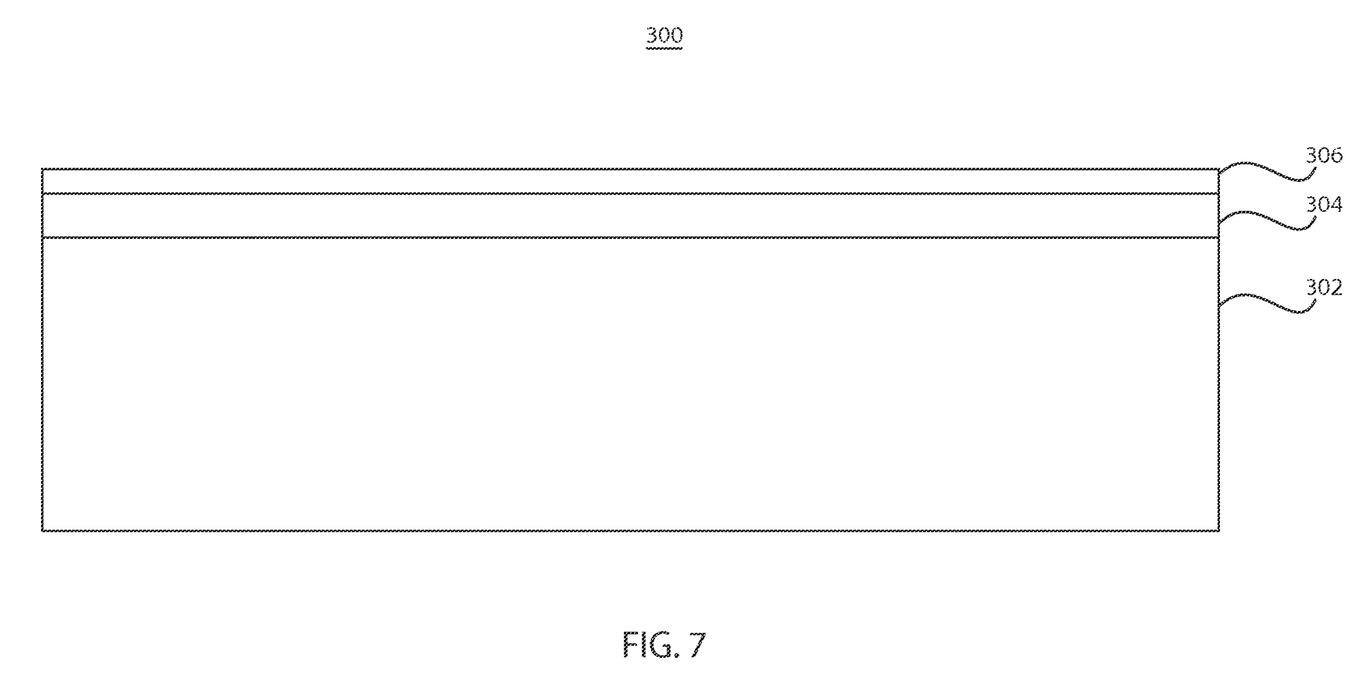
FIG. 7 is a cross-sectional view of a semiconductor structure having a semiconductor-on-insulator layer formed over a buried oxide layer, in accordance with one illustrative embodiment.

Referring now to FIG. 7, a semiconductor structure 300 is illustratively depicted in accordance with one embodiment. The present principles are applied to form multi-threshold voltage devices on FDSOI devices with thin BOX, such as ultrathin body and BOX (UTBB), having additional threshold voltage regions. The semiconductor structure 300 is formed in a semiconductor substrate 302, which may include a BOX layer 304 and SOI layer 306. BOX layer 304 is preferably a thin BOX layer, e.g., at or about 10-25 nm, but may also include other thicknesses (e.g., ultrathin, etc.). SOI layer 106 is preferably an ultrathin SOI layer, e.g., at or about 2-10 nm, but may also include other thicknesses. In some embodiments, the semiconductor structure 100 further comprises other features or structures that are formed in previous process steps.

Figure 8:
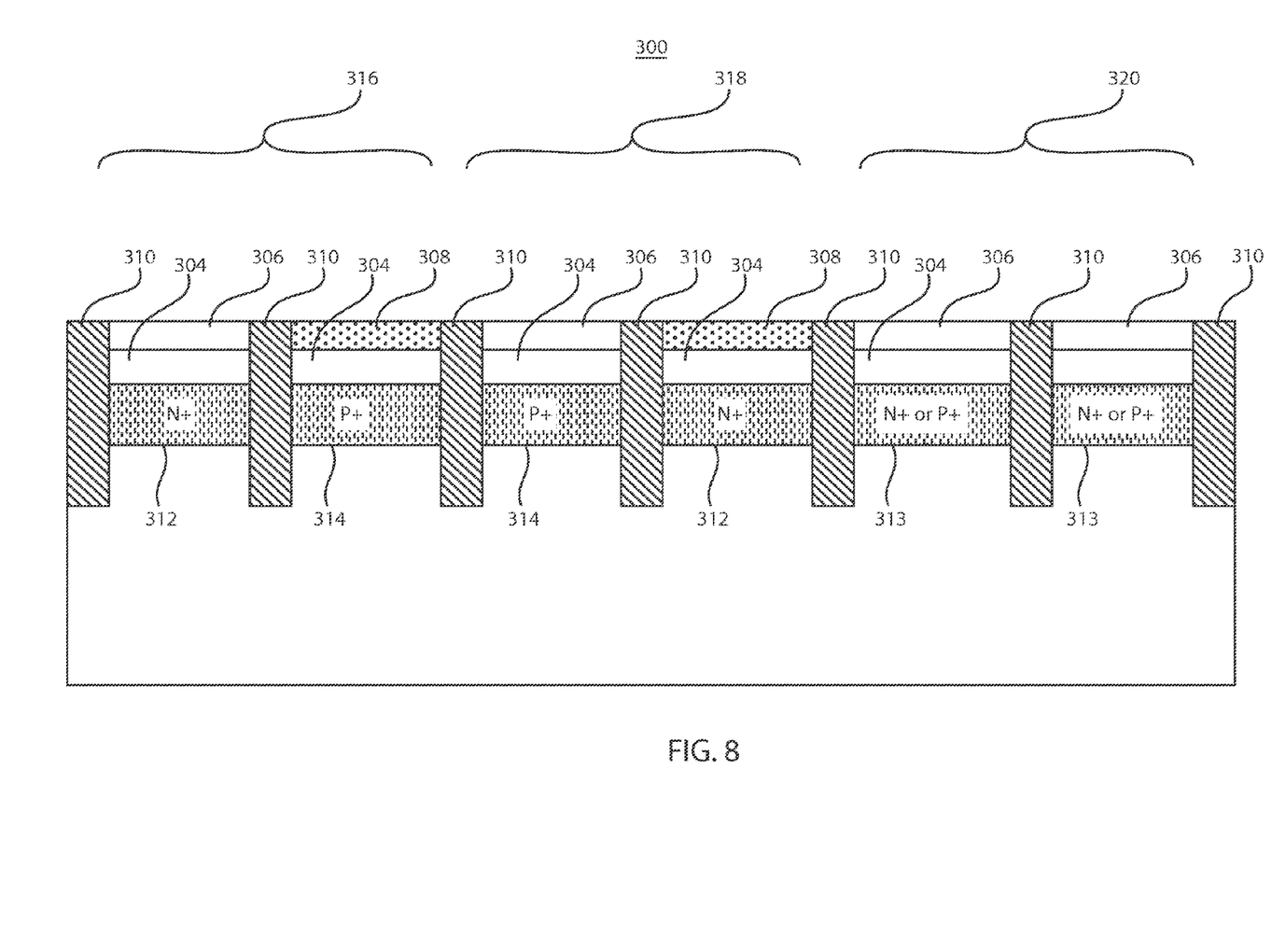
FIG. 8 is a cross-sectional view of the semiconductor structure of FIG. 7 after formation of shallow trench isolation regions, channel regions and pockets, in accordance with one illustrative embodiment.

Referring now to FIG. 8, processing of the semiconductor structure 300 is continued. The semiconductor structure 300 includes a first region 316, a second region 318 and a third region 320. The first region 316 may include a LVT region, such as, e.g., a logic region where timing is a constraint. The second region 318 may include a RVT region, such as, e.g., a logic region. The third region 320 may include a HVT region, such as, e.g., an SRAM region where leakage power is a constraint.

SiGe layers 308 are formed in portions of SOI layer 306. Forming SiGe layers 308 may include, for example, etching Si and growing SiGe, or diffusing Ge atoms into the Si layer, etc. Other techniques for forming SiGe layers 308 may also be employed.

Pockets 312, 313, 314 are formed under BOX layer 304 by implantation. Pockets 312, 313, 314 provide for the further adjustment of threshold voltage. Formation of pockets 312, 313, 314 may include forming a resist pattern (not shown) to protect portions of the substrate 302 and employing ion implantation to implant dopants into unprotected portions of substrate 302.

N-type dopants are implanted in pockets 312 at an implant dose range from, e.g., $10^{13}$/cm$^2$ to $10^{16}$/cm$^2$, with an implant energy range from, e.g., 5 KeV to 200 KeV, depending on the implant species. N-type dopants may include, e.g., phosphorous, arsenic, etc. P-type dopants are implanted in pockets 314 at an implant dose range from, e.g., $10^{13}$/cm$^2$ to $10^{16}$/cm$^2$, with an implant energy range from, e.g., 5 KeV to 200 KeV, depending on the implant species. P-type dopants may include, e.g., boron, boron fluoride, etc. Pockets 313 may include either n-type or p-type dopants, depending on the desired threshold voltage for the SRAM devices.

An n-type pocket reduces the threshold voltage of NFET and increases the threshold voltage of PFET. Similarly, a p-type pocket increases the threshold voltage of NFET and reduces the threshold voltage of PFET. Everything else being same, the difference in the threshold voltage of a transistor with n-type pocket compared to a transistor with p-type pocket is about 80-100 mV for a typical BOX thickness of 20-25 nm.

Ion implantation includes bombarding into substrate 302 with ions at angles of approximately 5 degrees to about 75 degrees with respect to a vertical-normal to a major surface of the device. Other angles of attack may also be employed. The parameters of the ion implantation may be adjusted to provide a desired dopant level.

STI dielectric regions 310 are formed by conventional methods to electrically separate devices and reduce parasitic currents and charge buildup. It should be understood that STI regions 310 may be formed before and/or after the formation of pockets 312, 313, 314.

Figure 9:
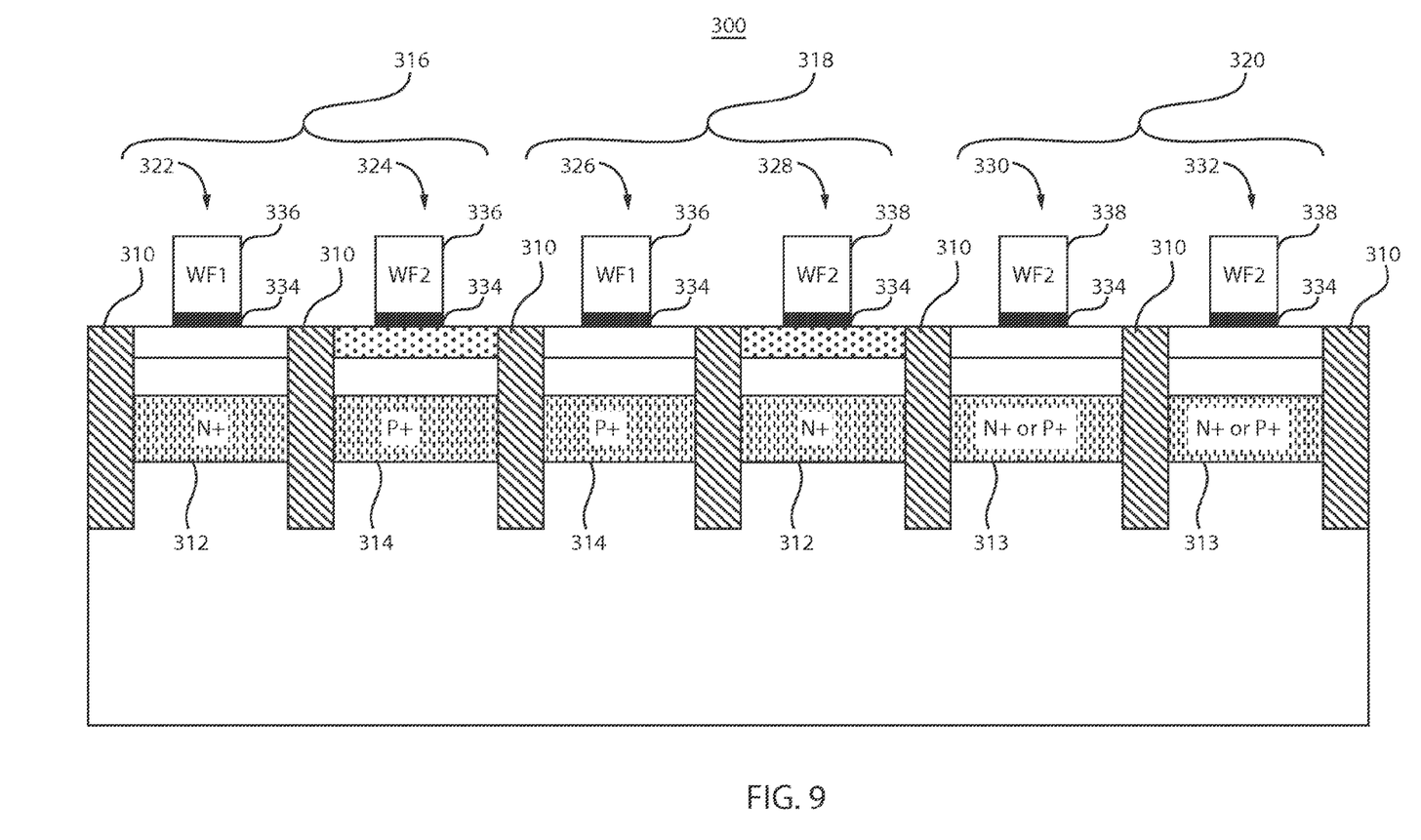
FIG. 9 is a cross-sectional view of the semiconductor structure of FIG. 8 having gate structures formed on the substrate, in accordance with one illustrative embodiment.

Referring now to FIG. 9, gate structures are formed on semiconductor structure 300. Devices 322, 324 are formed in LVT logic region 316, devices 326, 328 are formed in RVT logic region 318, and devices 330, 332 are formed in SRAM region 320. Additional devices and/or regions may be formed. Preferably, devices 322 and 324, devices 326 and 328, and devices 330 and 332 form CMOS devices including NFETs and PFETs. NFETs may include devices 322, 326 and 330. PFETs may include devices 324, 328 and 332. Devices 324 and 328 are preferably formed over SiGe layer 308.

Gate structures are formed including gate dielectrics 334 and gate electrodes 336, 338. In a preferred embodiment, gate electrodes 336 of NFET devices 322, 326 include a gate material having WF1, while gate electrodes 338 of PFET devices 324, 328, 332 and NFET device 330 include a gate material having WF2. Preferably, WF1 includes an n-type quartergap work function and WF2 includes a midgap work function. Other work functions may also be employed.

The SiGe channel of PFET devices 324, 328 gives a roughly 200-300 mV threshold voltage reduction compared to Silicon channel and midgap WF2. Backgate doping in implant pockets 312, 313, 314 gives roughly a 50-100 mV threshold voltage alteration, depending on the thickness of the BOX layer 304. Devices in LVT logic region 316 provide a long channel threshold voltage of around 250 mV, devices in RVT logic region 318 provide a long channel threshold voltage of around 350 mV, and devices in SRAM region 320 provide a long channel threshold voltage of around 500 mV, in accordance with one embodiment.

Figure 10:
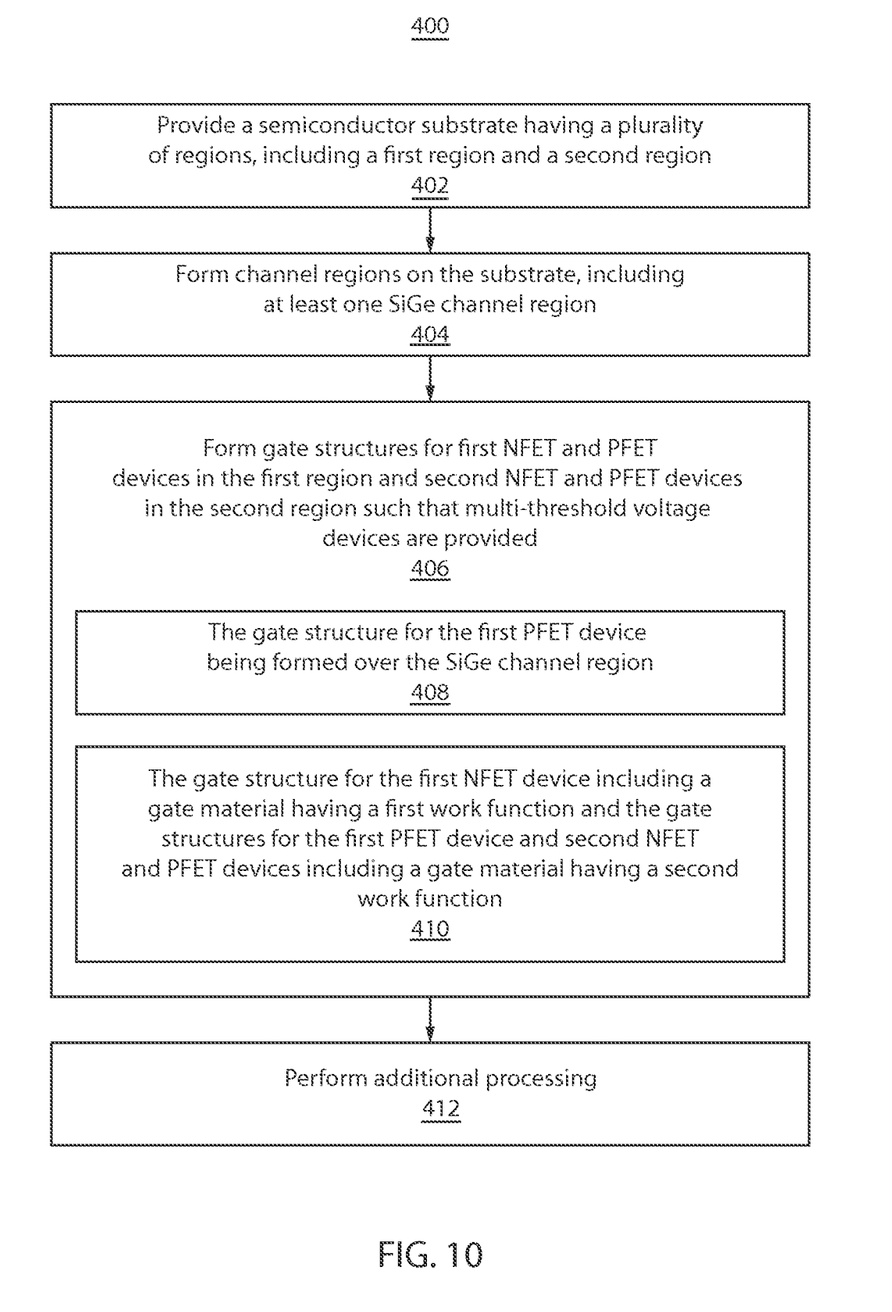
FIG. 10 is a block/flow diagram showing a system/method for forming multi-threshold voltage devices, in accordance with one illustrative embodiment.

Referring now to FIG. 10, a block/flow diagram showing a method of semiconductor fabrication 400 is illustratively depicted in accordance with one embodiment. In block 402, a semiconductor substrate is provided. The substrate is preferably a multilayer substrate, including, e.g., SOI, ETSOI, UTBB, etc. In some embodiments, a top layer of the substrate may be processed to form mandrels, which may include fins. The substrate may include a plurality of regions, including a first region and a second region. The first region may be a low threshold voltage region such as, e.g., a logic region. The second region may be a high threshold voltage region such as, e.g., an SRAM region.

In block 404, channel regions are formed on the substrate, including at least one SiGe channel region. Forming SiGe channel region may involve, e.g., etching the Si and epitaxially growing SiGe, diffusing Ge into the Si, etc. Other methods of forming SiGe channel region may also be employed.

In block 406, gate structures are formed for first NFET and PFET devices in the first region and second NFET and PFET devices in the second region. Gate structures are formed such that multi-threshold voltage devices are provided. Gate structures include gate dielectrics and gate electrodes. First NFET and PFET devices and second NFET and PFET devices preferably include CMOS devices. In block 408, the gate structure for the first PFET device is formed over the SiGe channel region, which is preferably strained but may be unstrained.

In block 410, the gate structure for the first NFET devices includes a gate material having a first work function and the gate structures for the first PFET device and the second NFET and PFET devices include a gate material having a second work function. In a preferred embodiment, the first work function includes a quartergap work function and the second work function includes a midgap work function.

It should be understood that additional regions may be employed having a different threshold voltage, in accordance with the present principles. For example, additional threshold voltage regions may be provided by backgate doping. Other methods of altering threshold voltage may also be employed, such as, e.g., gate length adjustment, channel doping, etc.

In one embodiment, the semiconductor substrate may also include a third region for a regular threshold voltage for a logic region. The third region may include a third NFET device having a gate material having the first work function and a third PFET device having a gate material having the second work function. The third PFET device is preferably formed over a SiGe channel region. Backgate doping is performed by forming pockets below the isolation (e.g., BOX) layer for each device formed on the substrate, e.g., by implantation. In the first region, the first NFET device includes a pocket doped with n-type dopants, and the first PFET device includes a pocket doped with p-type dopants. In the third region, the third NFET device includes a pocket doped with p-type dopants and the third PFET device includes a pocket doped with n-type dopants. The second NFET and PFET devices include pockets doped with a same type of dopants (i.e., either both n-type or both p-type). This results in a multi-threshold voltage scheme for each region of the substrate.

In block 412, additional processing is performed. This may include, e.g., forming spacers, source/drain regions, etc.

Having described preferred embodiments of a device and method of fabrication thereof for simplified multi-threshold voltage scheme for fully depleted semiconductor-on-insulator MOSFETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a substrate having a plurality of regions including a first region and a second region;
channel regions formed on the substrate including at least one Silicon Germanium (SiGe) channel region; and
gate structures for a first n-type field effect transistor (NFET) and a first p-type field effect transistor (PFET) in the first region and a second NFET and a second PFET in the second region, the gate structure for the first PFET being formed on the SiGe channel region,
wherein the gate structure for the first NFET includes a gate electrode material having a first work function having a quartergap work function and comprising at least titanium and nitrogen, and the gate structures for the first PFET, second NFET and second PFET include a gate electrode material including an aluminum containing layer atop a layer comprising at least titanium and nitrogen, the gate material having a second work function having a midgap work function such that multi-threshold voltage devices are provided, wherein the gate electrode material having the first work function is not present in the gate structures for the first PFET, second NFET and second PFET, and the gate electrode material having the second work function is not present in the gate structure for the first NFET.

2. The semiconductor device as recited in claim 1, further comprising gate structures for a third NFET and third PFET formed in a third region of the substrate, the gate structure for the third PFET being formed on a SiGe channel region.

3. The semiconductor device as recited in claim 2, wherein the gate structure for the third NFET includes a gate electrode material having the first work function and the gate structure for the third PFET includes a gate electrode material having the second work function.

4. The semiconductor device as recited in claim 1, further comprising pockets formed below an isolation layer of the substrate for each device.

5. The semiconductor device as recited in claim 4, wherein the pockets for the first NFET and third PFET are doped with n-type dopants.

6. The semiconductor device as recited in claim 4, wherein the pockets for the first PFET and the third NFET are doped with p-type dopants.

7. The semiconductor device of claim 1, wherein the gate material having the first work function is not present in the gate structures for the first PFET, second NFET and second PFET.

8. The semiconductor device of claim 1, wherien the gate material having the second work function is not present in the gate structure for the first NFET.

9. The semiconductor device of claim 1, wherein the gate electrode material having the first work function is not present in the gate structures for the first PFET, second NFET and second PFET, and the gate electrode material having the second work function is not present in the gate structure for the first NFET.

* * * * *